(12) United States Patent
Moyal

(10) Patent No.: US 7,123,065 B1
(45) Date of Patent: Oct. 17, 2006

(54) METHOD OF IMPROVING LOCK ACQUISITION TIMES IN SYSTEMS WITH A NARROW FREQUENCY RANGE

(75) Inventor: Nathan Moyal, West Linn, OR (US)

(73) Assignee: Cypress Semiconductor Corp., San Jose, CA (US)

( * ) Notice: Subject to any disclaimer, the term of this patent is extended or adjusted under 35 U.S.C. 154(b) by 53 days.

(21) Appl. No.: 10/847,930

(22) Filed: May 17, 2004

Related U.S. Application Data (60) Provisional application No. 60/483,331, filed on Jun. 27, 2003.

(51) Int. Cl.
*H03L 7/06* (2006.01)

(52) U.S. Cl. .......................... 327/156; 331/34

(58) Field of Classification Search ............ None
See application file for complete search history.

(56) References Cited

U.S. PATENT DOCUMENTS

| | | | |
|---|---|---|---|
| 4,590,440 A * | 5/1986 | Haque et al. | 331/17 |
| 5,436,597 A * | 7/1995 | Dunlap et al. | 331/1 A |
| 6,188,739 B1 * | 2/2001 | Everitt et al. | 375/376 |
| 6,853,254 B1 * | 2/2005 | Li | 331/16 |

* cited by examiner

*Primary Examiner*—Timothy P. Callahan
*Assistant Examiner*—Cassandra Cox
(74) *Attorney, Agent, or Firm*—Marger Johnson & McCollom, P.C.

(57) ABSTRACT

The present invention adds an additional feedback loop to a phase locked loop (PLL). The additional feedback loop detects if the actual output frequency of the PLL is above or below the desired output frequency. If the actual output frequency is above the desired output frequency a signal is added to the forward path of the PLL to decrease the frequency of the PLL oscillator. If the actual output frequency is below the desired output frequency a signal is added to the forward path of the PLL to increase the frequency of the PLL oscillator.

20 Claims, 7 Drawing Sheets

METHOD OF IMPROVING LOCK ACQUISITION TIMES IN SYSTEMS WITH A NARROW FREQUENCY RANGE

RELATED APPLICATION

This application is a non-provisional application of provisional application Ser. No. 60/483,331 filed Jun. 27, 2003. Priority of application 60/483,4331 is hereby claimed.

FIELD OF THE INVENTION

The present invention relates to electronic circuits and more particularly to electronic phase locked loops.

BACKGROUND OF THE INVENTION

Phase-locked loops (PLLs) are feedback control systems that are often an essential part of many telecommunications devices. PLLs are used in modulators and demodulators, in frequency synthesizers, in clock synchronizations circuits and in many other high-speed communication applications. PLL can be implemented using digital or analog devices.

Figure 1A:
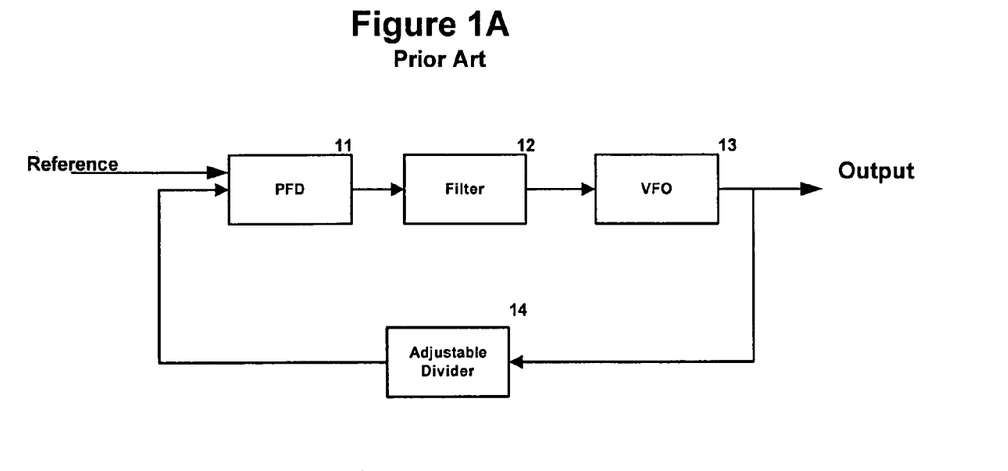
FIGS. 1A and 1B show a prior art PLL and its operation.

FIG. 1A shows a block diagram of a prior art PLL. The PLL shown in FIG. 1 includes four main components, namely, a Phase Frequency Detector (PFD) 11, a Filter 12, a Variable Frequency Oscillator (VFO) 13 and feedback loop with an adjustable frequency divider 14. The VFO 13 could for example be a Voltage Controlled Oscillator (VCO).

The PFD 11 compares the phase and frequency of the feedback signal to the reference signal and it generates an error signal indicating any difference it detects. The error signal generated by PFD 11 passes through the filter 12 and is used to adjust the frequency of the VFO 13. Any differences between the input signal and the feedback signal are thus used to change the frequency of the VFO.

A PLL can be used as a frequency multiplier. For example, in the circuit shown in FIG. 1, the output of the reference signal may be a 10 Mhz signal. The output of the VCO may for example be a 1 Ghz signal. In such a PLL the frequency divider 14 would divide the 1 Ghz output signal down to a 10 Mhz signal. The frequency divider 14 can be adjusted to a higher or lower divisor in order to change the output frequency of the PLL.

There is great deal of published literature which describes the design and operation of prior art PLLs. For example, PLL technology is described in a text book entitled "Phase-Locked Loops" by Roland Best, ISBN: 0071412018, dated Jun. 20, 2003. Other books and literature which describe the principles and applications of PLL are also available.

Figure 1B:
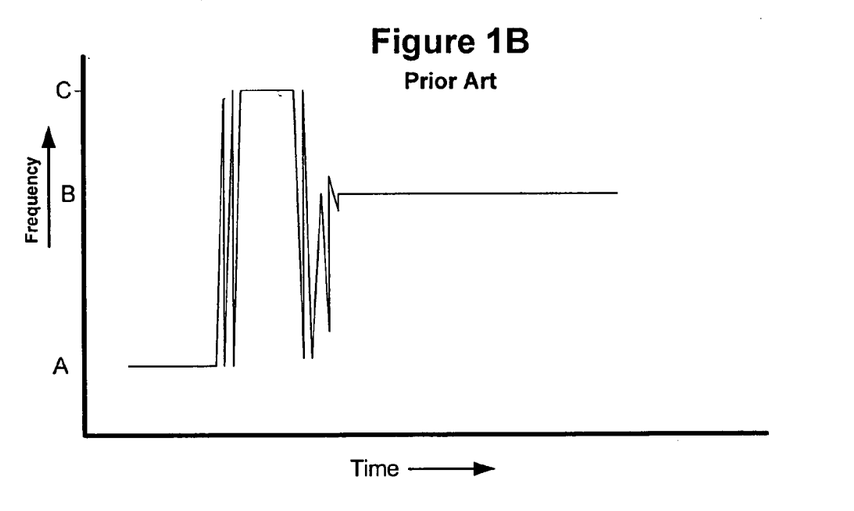

When the frequency of a prior art PLL is changed, some time is required for the circuit to move between frequencies. FIG. 1B illustrates that as a PLL moves from a frequency A to a frequency B, the frequency may first go to a frequency C which is highest frequency at which the circuit is capable of operating. It may lock at this frequency for some time and finally drop back down to frequency A. FIG. 1B is intended merely to show that the frequency fluctuates or varies and that it may lock at the circuit's upper (or lower) frequency for a considerable time period. In general, the locking can be caused by physical limitations of the circuit, such as, not enough frequency range or not enough voltage range of the filter. While (for convenience of illustration) only a few fluctuations (or oscillations) are shown in FIG. 1B, in general, there will be may such fluctuations. The important point that FIG. 1B illustrates is that when the frequency of the circuit is changed, a considerable time may elapse before the circuit settles down at its new frequency.

It is often desirable to have a circuit that settles quickly when the operating frequency is changed. This can be particularly important in applications such as in radio frequency (RF) circuit which do frequency hopping and which have a "tight" frequency range. In such circuits it is important that the circuit settle at a new frequency quickly. Furthermore, such circuits may have a tendency to clamp at the extreme upper and lower frequency limits for a considerable period of time (relative to the frequency period), when the frequency of the circuit is adjusted.

Several different techniques are known to shorten the time required for a PLL to settle at a new frequency. One such prior art technique uses a VCO that has a wider frequency range than what is actually needed. In order to have a wide frequency range, the VCO must have a large VCO gain Kv (MHz/V). In general, VCOs with large Kv are undesirable because they will consume more power, be susceptible to noise at the input to the VCO, and will also exhibit different behavior (e.g., lock times and PLL bandwidth) than the VCO with a small Kv.

Another prior art technique uses a dual-gain scheme of coarse and fine gain control for the VCO. The disadvantage to this technique is that it greatly increases the complexity of the VCO design, complicates the overall system design (when to switch between coarse and fine gain, how to handle the coarse to fine transition, etc.), requires additional devices and therefore a larger layout, and also requires high power since the counters must be able to keep up with the VCO frequency.

A third prior art technique is to adjust the PLL to have a large forward gain. This may be accomplished by adjusting the VCO gain, the pump current, or filter parameters. This technique also complicates the PLL design and requires high power for the counters to keep up with the VCO frequency. Additionally, in the problem area where the VCO is clamped, adjusting the PLL parameters is useless. Furthermore, speeding up the lock response may cause even more overshoot into the clamped region of the VCO, which actually hurts lock time.

The present invention provides an improved technique for decreasing the amount of time required for a PLL to settle at a new frequency when the frequency of the PLL is changed.

SUMMARY OF THE PRESENT INVENTION

The present invention adds an additional feedback loop to a phase locked loop (PLL). The additional feedback loop detects if the actual output frequency of the PLL is above or below the desired output frequency. If the actual output frequency is above the desired output frequency a signal is added to the forward path of the PLL to decrease the frequency of the PLL oscillator. If the actual output frequency is below the desired output frequency a signal is added to the forward path of the PLL to increase the frequency of the PLL oscillator.

DETAILED DESCRIPTION OF EMBODIMENTS

Figure 2A:
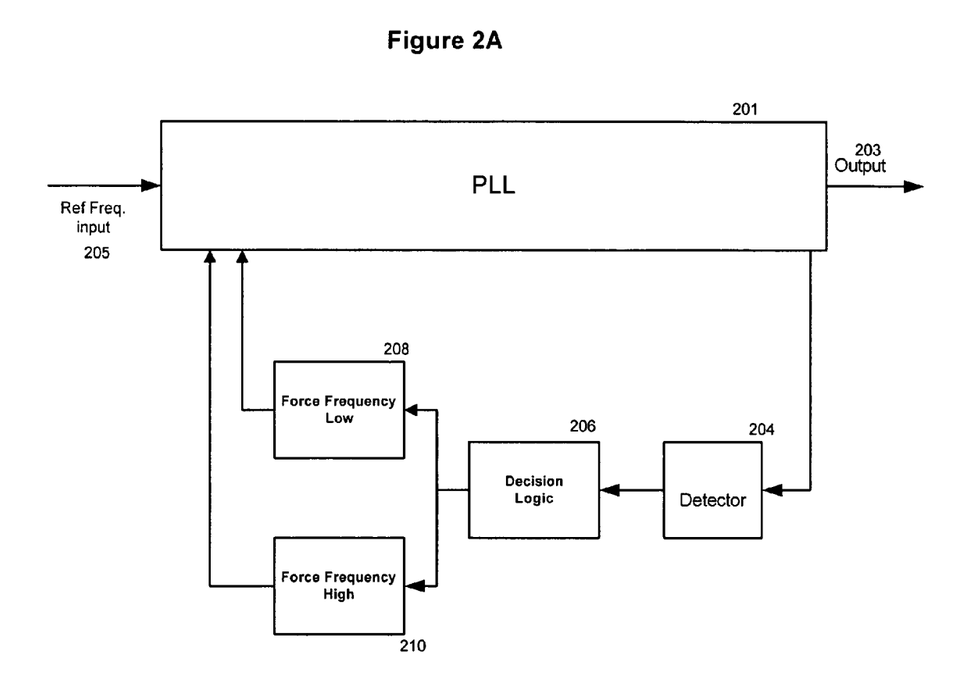
FIGS. 2A and 2B are an overall block diagram of the embodiments of the present invention.

The block diagram in FIG. 2A is a general block diagram that pertains to several different preferred embodiments of the invention. More detailed diagram of specific preferred embodiments are provided in FIGS. 3 to 6.

FIG. 2 shows a Phase Locked Loop (PLL) 201 which has in input reference frequency 201 and an output 203. The circuitry represented by block 204 to 210 provide a mechanism for getting the PLL 201 to lock on or settle at a desired frequency quickly when the PLL is first activated and when the operating frequency of the PLL is changed.

It is noted that the reference signal 205 may be provided directly from a crystal oscillator (not shown in the Figure). Alternatively, a crystal controlled oscillator (or some other type of oscillator, may provide input to frequency divider, which in turn generates the input reference signal 205.

Figure 2B:
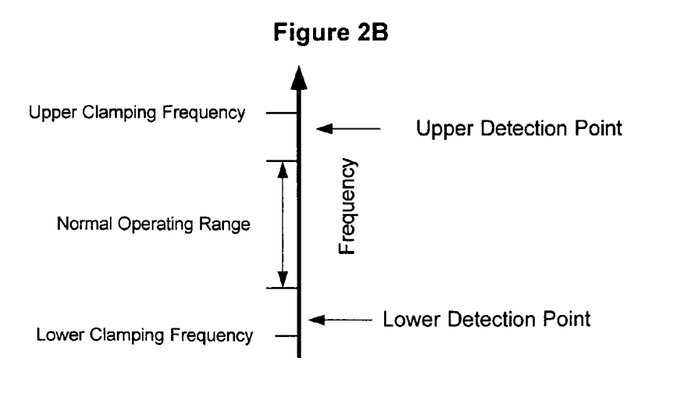

FIG. 2B illustrated the normal operating range of PLL 201. FIG. 2B also shows the upper clamping frequency of the PLL 201 and the lower clamping frequency of the PLL 201. As shown in FIG. 1B, when a PLL is first activated (or when the operating frequency is changed), the PLL first has a transient response. The PLL may oscillate and it may clamp at the upper (or lower) frequency for a relatively long period before it settle at the desired. This is a well known phenomenon. The circuitry shown in FIG. 2A minimizes the time required for a PLL to settle into a desired frequency.

FIG. 2A also illustrates an upper detection point and a lower detection point. The upper and lower detection points are slightly removed from the upper clamping frequency and the lower clamping frequency.

The detector 204 detects that the PLL has reached the upper or lower detection points. It is noted that this detection may be determined by a measurement of the actual output frequency of the PLL, or it may be indirectly determined by a measurement of other parameters. For example the detector may look at the input voltage to the VFO in the PLL and from this determine that the PLL is being driven to its upper clamping frequency.

Alternatively the detection can be at various other points in the forward or return parts of the PLLs feedback loop. The output of detector 204 provides an input to detector logic 206 which determines if the output frequency of the PLL has reached the upper detection point of if the output of the PLL has reached the lower detection point.

Depending upon the determination made by logic 206, either circuit 208 or circuit 210 is activated. It is noted that although the detector 204 and the decision logic 206 are shown by two block in FIG. 2A, this represents the function performed. In some embodiments, the function indicated by these two blocks can be integrated and performed by a single circuit.

If circuit 208 is activated it indicates that the frequency of the PLL has reached the upper detection point and a signal is sent to the PLL 201 to lower its frequency. Alternatively if circuit 210 is activated it indicates that the frequency of the PLL has reached the lower detection point and a signal is sent to the PLL 201 to raise its frequency.

The circuitry indicated by blocks 204, 206, 208 and 210 thus provide an additional feedback loop that helps the PLL more quickly settle into a frequency. The frequency at which this secondary feedback lop operates is much lower than the frequency at which the primary feedback loop in the PLL operates. Furthermore this secondary feedback loop is only operational when the PLL is changing frequency or when the PLL is initially activated. With respect to FIG. 1B, this secondary feedback loop shortens the time between T1 when the PLL is activated (or when its frequency is changed) and the time T2 at which the PLL finally settles into a particular frequency.

As indicated above, the detector 204 could for example detect voltage at the input of the VFO rather than directly detecting output frequency. The labels on FIG. 2B indicate that the figure shows a frequency range. It is noted that alternatively, the figure could for example represent a range of voltages at the input of the VFO. Thus a Figure similar to FIG. 2B could show the normal voltage range at the input of the VFO and the upper and lower detection voltages.

The following is a specific example of the detection points for a PLL that has a target or mid frequency of 2.4 Ghz, and upper (or maximum) and lower (or minimum) frequencies could be 2.6 Ghz and 2.2 Ghz. The actual parameter measured might be the voltage at the input of the VFO. The voltage at the input to the VFO could, for example, have an upper clamping voltage of 3 volts and a lower clamping voltage of 0.3 volts. In such a circuit, the upper and lower detection points could be 2.5 volts and 0.7 volts. It is noted that the voltage at the input of the VFR may continue to rise even after the VFO has reached its maximum frequency, thus there is not a direct correlation between output frequency and voltage at the input of the VFR. The example given above is merely for illustrative purposes. The upper and lower clamping frequencies (and the upper and lower voltages and the detection voltages) of any particular PLL are dependent are dependent upon various engineering design consideration and likewise the gap between the upper and lower detection points and the clamping frequencies is a matter of engineering design choice.

The system shown in FIG. 2A can be actually implemented in a wide number of ways. For example the system can be implemented completely by analog components. Alternatively, at least some of the components may be digital components. In other embodiments, the entire system may be implement by a program operating in a programmed computer.

Figure 3:
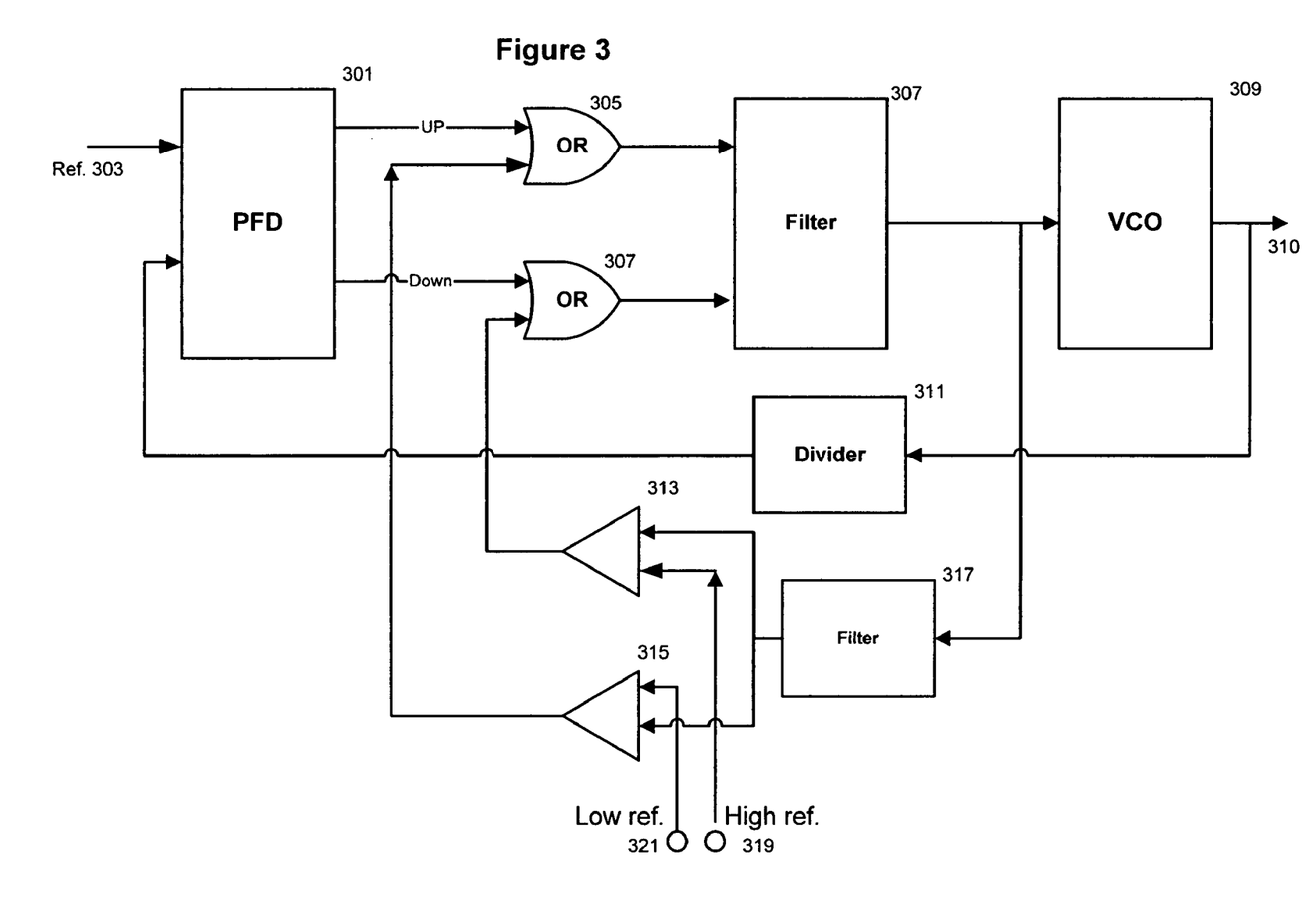
FIG. 3 is a detailed circuit diagram of a first preferred embodiment of the invention.

FIG. 3 shows a detailed diagram of a first preferred embodiment of the system which implements the system shown in FIG. 2A. The PFD has an input frequency reference signal 303 and an output 310. The PLL shown in FIG. 3 has a normal PFD 301, filter 307, VCO 309 and frequency divider 311. These units are similar to the corresponding components shown in FIG. 1.

The input to the VCO 309 is connected to the input of filter 317. The output of the filter 317 provides an input to comparators 313 and 315. The filter 317 filters the input to VCO 309 and slows down and even out the response of the comparators 313 and 315. Filter 317 and comparators 313 and 315 corresponding to detector 204 and decision logic 206 shown in FIG. 2A.

The comparator 315 compares the output of filter 317, to the low reference voltage 321. The low reference voltage 321 corresponds to the lower detection point in FIG. 2A. The comparator 313 compares the output of filter 317, to the high reference voltage 319. The high reference voltage 319 corresponds to the upper detection point in FIG. 2A.

When the output of comparator 315 is activated it indicates that the output of the PLL has reached the lower detection point shown in FIG. 2A and that the frequency needs be increase. This signal passes through OR circuit 305 to increase the frequency. When the output of comparator 313 is activated it indicates that the output of the PLL has reached the upper detection point shown in FIG. 2A and that the frequency needs be decrease. This signal passes through OR circuit 307 to decrease the frequency.

The circuit shown in FIG. 3 operates as follows: If the voltage at the input of VCO is high enough that the loop is being driven above the upper detection point (see FIG. 2B), a signal is generated by comparator 313. This signal is applied to filter 307 to lower the frequency of the PLL loop. If the voltage at the input of VCO is so low that the loop is being driven above the lower detection point (see FIG. 2B), a signal is generated by comparator 315. This signal is applied to filter 307 to raise the frequency of the PLL loop. It is noted that the signal for the input of VCO 309 is filtered by filter 317 to eliminate any short transients and to slow down the operation of the secondary feedback loop.

Figure 4A:
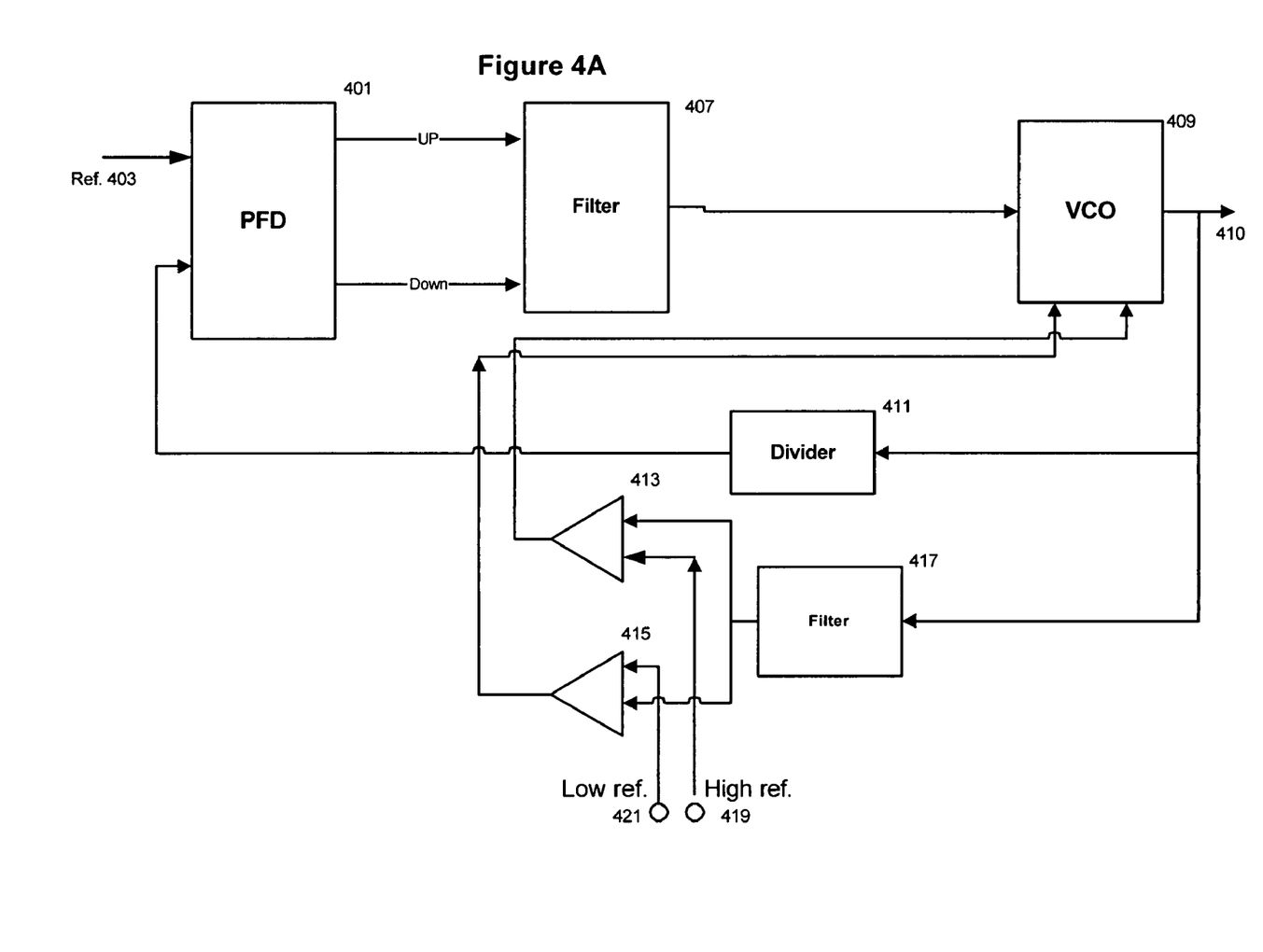
FIGS. 4A and 4B are a detailed circuit diagram of a preferred embodiments of the invention.

A circuit diagram of a different embodiment of the invention is shown in FIG. 4A. The embodiment shown in FIG. 4A includes a referenced input 403, a PFD 401, a filter 407, and a frequency divider 411 that are similar to those shown in FIG. 1 and FIG. 3. The output of filter 407 drives a VCO (voltage controlled oscillator) 409. The details of the circuitry in VCO 409 will be described later.

The ref input 403, the filter 407, the VCO 409 and the feedback loop which includes frequency divider 411, constitute a Phase Locked Loop (PLL), that in general, operates similar to the PLL shown in FIG. 1A.

In the embodiment shown in FIG. 4A, the signals from the secondary feedback loop provide inputs to the VCO rather than to the filter 407 as is done in the embodiment shown in FIG. 3. Furthermore in the embodiment shown FIG. 4, the input to the secondary feedback loop is taken from the output of the VCO 409 rather than from the input to the VCO as is done in the embodiment shown in FIG. 3.

The secondary feedback loop in the embodiment shown in FIG. 4 includes filter 417, and comparators 413 and 415. The filter 417 and the comparators 413 and 415, taken together, correspond to the detector 204, the decision logic 206k and the circuits 208 and 210 shown in FIG. 2A.

The filter 417, removes the high frequency component from the signal at the output 410. The output of the filter 417 in effect indicates the frequency at which the PLL loop is operating at any particular time.

The output of filter 417 is compared to a high reference signal 419 and to a low reference signal 421. This comparison is performed by circuits 413 and 415. A signal at the output of circuit 415 indicates that the output of the PLL has reached the lower detection point indicated in FIG. 2B. A signal at the output of circuit 413 indicates that the output of the PLL has reached the upper detection point indicated in FIG. 2B.

The outputs from circuits 413 and 415 provide inputs to VCO 409 which increase or decrease the frequency of the signal generated by the VCO 409. The filter 417 and the circuits 413 and 415 provide a relatively low frequency secondary feedback loop for the PLL. This secondary feedback loop insures that the PLL will not stay at its upper or lower clamping frequency for an extended period of time. Stated differently, the secondary feedback loop insures that when the PLL is initially activated or when the frequency of the PLL is changed (by for example changing the amount of division performed by divider 411) the PLL will settle at its new frequency in a relatively short period of time.

Figure 4B:
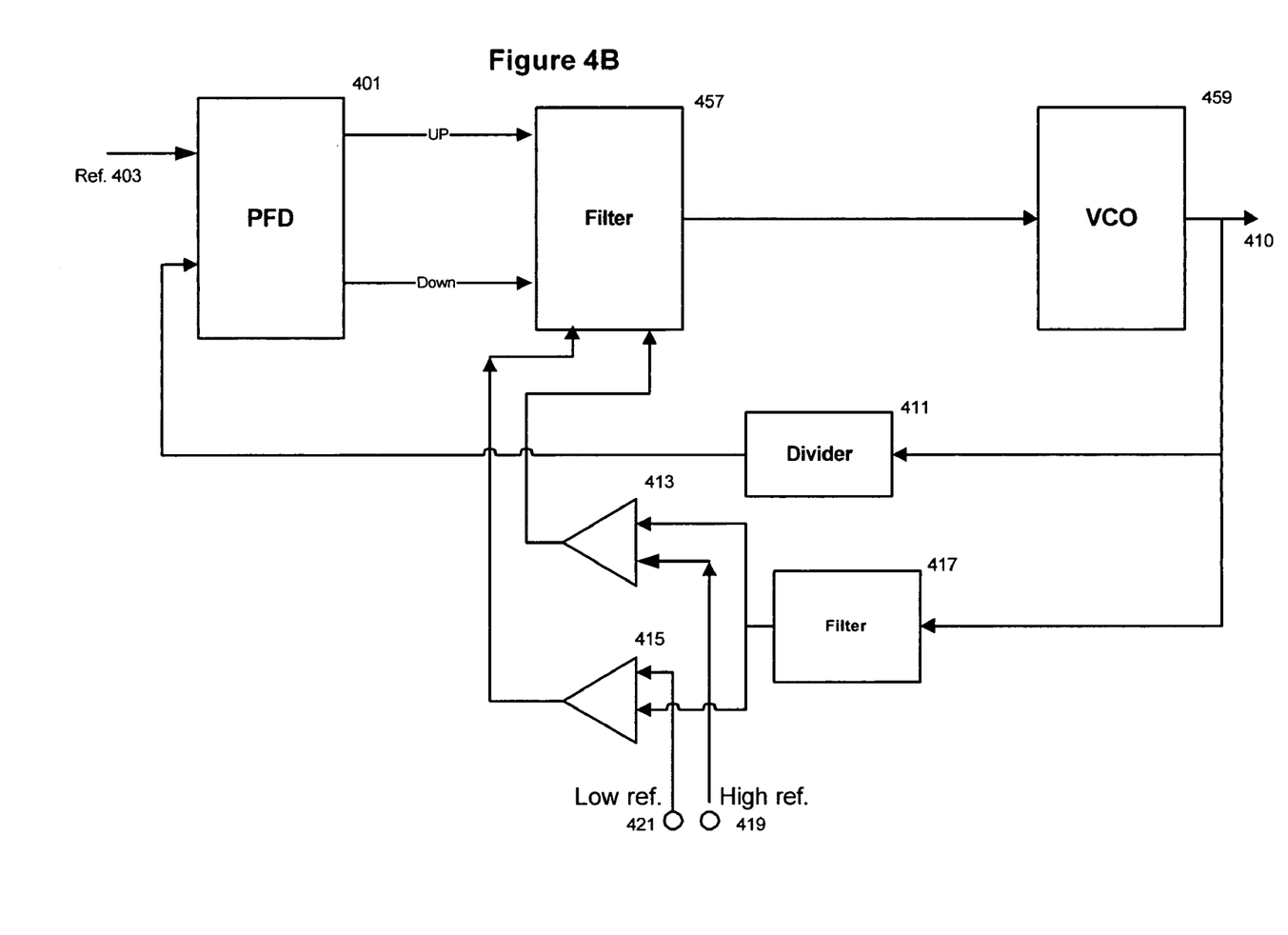

FIG. 4B shows another embodiment. The embodiment in FIG. 4B is similar to the embodiment shown in FIG. 4A, expect that the output of the circuits 413 and 415 provide inputs to modify the operation of filter 407 rather than to modify the operation of VCO 409 as shown in FIG. 4A. That is, all components in the embodiment shown in FIG. 4B are similar to the corresponding elements in FIG. 4A, except that filter 407 has been replaced by Filter 457 and VCO 409 has been replaced by VCO 459.

It is noted that a wide variety of embodiments are possible where different the output signal form the secondary feedback loop in introductory at various places in the primary feedback loop of the PLL. The systems shown in FIGS. 4A and 4B are examples to show two places when the output of the secondary feedback loop can be introduced into the primary feedback loop. It should however, be understood that various other embodiments are possible when the output of the secondary feedback loop is introduced into different places in the primary feedback loop.

The overall operation of the system is generally the same, irrespective of where the feedback signal form the secondary feedback loop is introduced into the primary feedback loop. Naturally, however, the engineer details would change depending on how the signal from the secondary feedback loop is introduced into the primary feedback loop.

Figure 5:
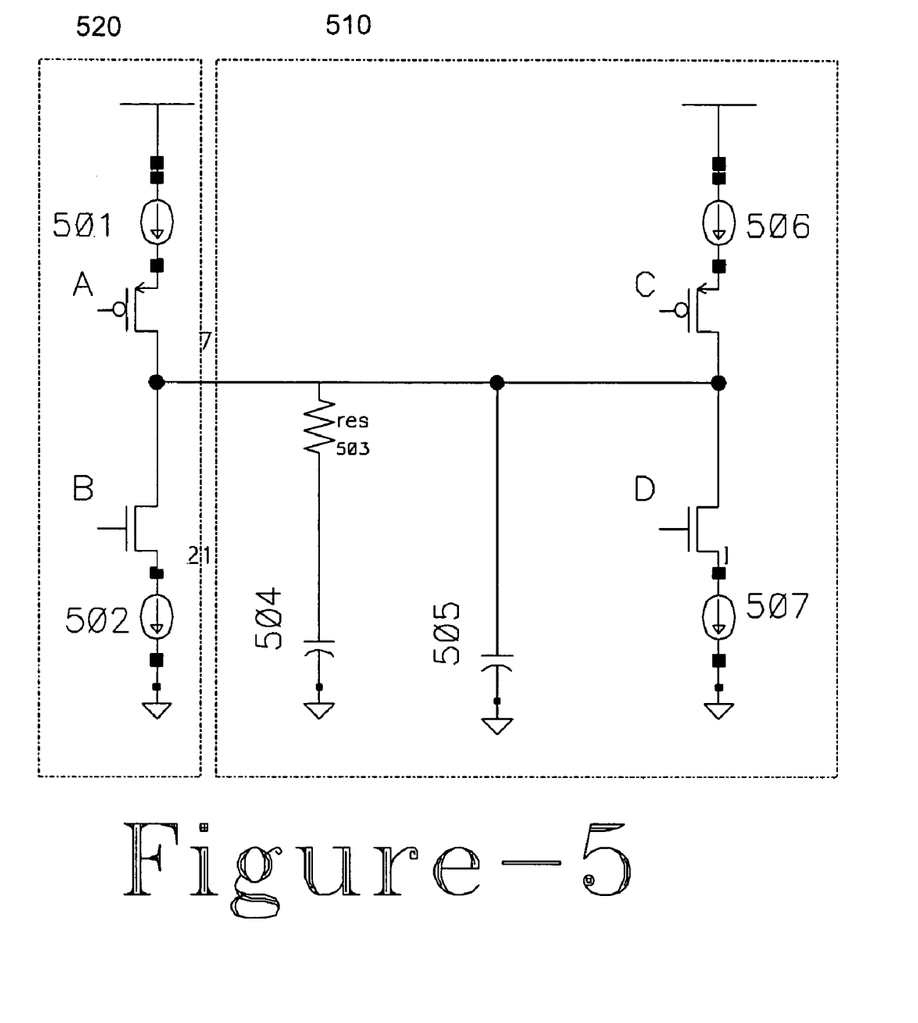
FIG. 5 is a detailed circuit diagram of a filter shown in FIG. 4B.
Figure 6:
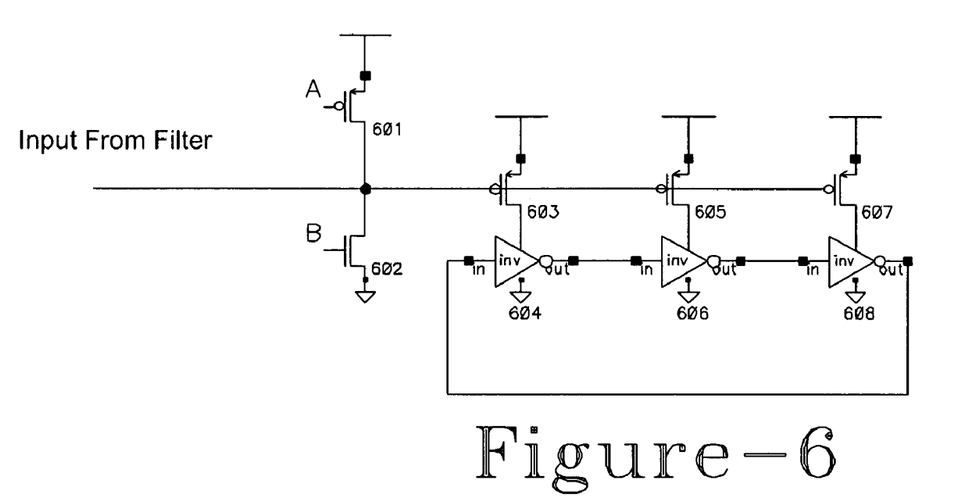
FIG. 6 is a detailed circuit diagram of a VCO shown in FIG. 4A.

FIGS. 5 and 6 show details circuit diagrams of illustrative embodiments of the VCO 409 shown in FIG. 4A and the filter 457 shown in FIG. 4B. That is, FIG. 5 shows the details of filter 457 which accepts inputs from both the primary feedback loop and from the secondary feedback loop. FIG. 6 shows the details of VCO 409 which accepts inputs from both the primary feedback loop and from the secondary feedback loop. Naturally, it should be understood that the specific circuits shown in FIGS. 5 and 6 are merely simple illustrative of VCO 409 and filter 457. These elements can be implemented in a wide variety of other ways in accordance with principles will known within the art.

FIG. 5 is a detailed circuit diagram showing an example of filter 457 shown in FIG. 4B. Filter 457 as shown in FIG. 4B has four inputs. Two of the inputs are from PFD 401 and they indicate that the frequency should be increased or decreased. These are normal PLL feedback loop signals. The filter also has two inputs from the secondary feedback loop circuits 413 and 415. These signals are only active when the PLL is starting or when it is changing frequency and they indicate that the PLL has crossed upper or lower detection points shown in FIG. 2B. In FIG. 5, these inputs are designated A, B, C and D.

It is noted that the circuit shown in FIG. 5, is only a simple example of an embodiment of filter 457. Various other embodiments are possible designed in accordance with normal filter design principles.

As shown in FIG. 5, the filter has two main parts. The first part is a normal type of filter 510. The second part of the circuit is a forcing circuit 520. The filter 510 includes resister 503 and capacitors 504 and 505 which form a normal filter. The circuit has an output E, which provides a voltage to control VCO 459. Two transistors 506 and 507 provide inputs to the filter. Each of these transistors has an appropriate current source indicated by the circle with an arrow next to each transistor. It is noted that input C to transistor is inverted, as indicated by the small circle at the input C.

Forcing circuit 520 receives inputs from circuits 413 and 415. The circuit 520 includes two transistors 501 and 502 which provide a positive or negative input to the filter section 510. Each of these transistors has an appropriate current source indicated by the circle with an arrow next to each transistor. Signals at terminals A and B activate the associated transistors thereby moving the out E either up or down depending upon which transistor is activated.

Stated differently, if input B is tied to a power source through circuit 413, the output E is forced toward ground potential and the VCO frequency is decreased. In input A is tied to power (note the input is inverted at transistor 501) through circuit 415, the output E is forced to a higher potential and the VCO frequency is increased.

FIG. 6 shows an example of a specific circuit to implement VCO 409 shown in FIG. 4A. It is noted that a wide array of alternate implementations are possible. The circuit shown in FIG. 6 includes a simple VCO formed by three inverters connected in a ring. The inverters 604, 606, and 608, each have an associated control transistor 603, 605 and 607. A signal applied to these control transistors controls the frequency of the ring. The circuit includes two additional inputs designated A and B and two transistor switches 601 and 602. The inputs A and B receive signals from circuits 413 and 415. The input to transistor 601 switch 601 is inverted as indicated by the small circle.

If signals from circuits 413 and 415 tie inputs A or B to power, it forces the control voltage to ground and increases the frequency of the VCO. If signals from circuits 413 and 415 tie inputs A or B to power, it increases the control voltage and the output frequency is decreased. In the normal mode, when there are no signals from circuits 413 and 415, A is tied to power and B is tied to ground.

While various embodiments of the invention have been shown, and described it should be understood that various other embodiments are possible. Various changes in the embodiments shown may be made without departing from the spirit and scope of the invention. The scope of the invention is limited only by the appended claims.

I claim:

1. A system which includes:
a first phase frequency detector (PFD)
a first filter,
a voltage controlled oscillator (VCO),
a frequency divider,
said PFD, said first filter, said VCO and said frequency divider being connected in a feedback loop to form a phase locked loop (PLL) which has an upper and lower cutoffs and an operating range,
a secondary feedback loop including
a second detector for detecting when said PLL is approaching said upper and lower cutoffs and for then generating a detector output signal, and
forcing circuitry responsive to a signal from said second detector which forces the output of said PLL lower when said PLL is approaching said upper cutoff and which forces the output of said PLL higher when said PLL is approaching said lower cutoff.

2. The system recited in claim 1 wherein said secondary feedback loop provides an input to said VCO.

3. The system recited in claim 1 wherein said secondary feedback loop includes a filter.

4. The system recited In claim 1 wherein VCO has an input, the voltage on which controls the operating frequency of said VCO, and said secondary feedback loop includes a voltage detector that detects said voltage to determine when said PLL is out of said operating range.

5. The system recited in claim 1 wherein said secondary feedback loop includes a second filter and comparison logic to compare a second filter output signal to a particular upper detection value.

6. The system recited in claim 1 wherein said secondary feedback loop includes a second filter and comparison logic to compare a second filter output signal to a particular lower detection value.

7. The system recited in claim 1 wherein said secondary feedback loop includes a second filter and comparison logic to compare a second filter output signal to a particular upper detection frequency value and to a particular lower detection value.

8. The system recited in claim 7 wherein the frequency of said PLL is lowered when said secondary feedback loop detects that said second filter output signal has exceeded said upper detection value.

9. The system recited in claim 7 wherein the frequency of said PLL is raised when said secondary feedback loop detects that said second filter output signal is less than said lower detection value.

10. The system recited in claim 1 wherein the frequency of said VCO is controlled by a voltage signal from said filter, and wherein said detector detects the value of said voltage.

11. The system recited in claim 10 wherein said forcing circuitry increases or decreases the voltage at the input of said VCO.

12. The system recited in claim 10 wherein said forcing circuitry increases or decreases the voltage at the input of said first filter.

13. A system which includes:
a Phase Locked Loop (PLL),
said PLL having an upper and lower cutoffs and an operating range,
a secondary feedback loop including
a detector for detecting when said PLL is approaching said upper and lower cutoffs and for then generating an detector output signal when said PLL is approaching said upper and lower cutoffs, and
forcing circuitry responsive to a signal from said detector, which forces the output of said PLL lower when said PLL is approaching said upper cutoff and which forces the output of said PLL higher when said PLL is approaching said lower cutoff.

14. The system recited in claim 13 wherein said PLL includes a voltage controlled oscillator.

15. The system recited in claim 14 wherein said VCO includes an input, the voltage on which controls the frequency of said VCO.

16. The system recited in claim 15 wherein said detector detects the voltage on said input to determine if said PLL is approaching said upper and lower cutoffs.

17. A system which includes:
a Phase Locked Loop (PLL),
said PLL having an upper and lower cutoffs, upper and lower detection values and an operating range,
a secondary feedback loop including
detector means for detecting when said PLL has reached said upper and lower detection values and for then generating a detector means output signal when said PLL has reached said upper and lower detection values, and
forcing means response to said detector means output signal for forcing the frequency of said PLL lower when said detector means determines that said PLL has reached said upper cutoff and for forcing the frequency of said PLL high when said detector means determines that said PLL has reached said lower cutoff frequency.

18. The system in claim 17 wherein said upper detection value is less than said upper cutoff value and said lower detection value is greater than said lower cutoff value.

19. The system recited in claim 17 wherein said PLL includes a voltage controlled oscillator the frequency of which is controlled by a signal on a voltage input and wherein said forcing means applies a voltage to said voltage input.

20. The system recited in claim 17 wherein said PLL, has a forward path and a return path and said forward path includes a filter which has a voltage input, said forcing means including means to apply a voltage to said voltage input of said filter.

* * * * *